(12) United States Patent
Kim et al.

(10) Patent No.: US 9,941,280 B2
(45) Date of Patent: Apr. 10, 2018

(54) SEMICONDUCTOR DEVICE USING THREE DIMENSIONAL CHANNEL

(71) Applicant: Samsung Electronics Co., Ltd., Suwon-si, Gyeonggi-do (KR)

(72) Inventors: Kwan-Young Kim, Seoul (KR); Jae-Hyun Yoo, Suwon-si (KR); Jin-Hyun Noh, Seoul (KR); Woo-Yeol Maeng, Gunpo-si (KR); Yong-Woo Jeon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/228,292

(22) Filed: Aug. 4, 2016

(65) Prior Publication Data

US 2016/0343711 A1 Nov. 24, 2016

Related U.S. Application Data

(63) Continuation of application No. 14/803,265, filed on Jul. 20, 2015, now Pat. No. 9,437,730.

(30) Foreign Application Priority Data

Nov. 21, 2014 (KR) .......................... 10-2014-0163378

(51) Int. Cl.
*H01L 27/088* (2006.01)
*H01L 29/78* (2006.01)
(Continued)

(52) U.S. Cl.
CPC ........ *H01L 27/0886* (2013.01); *H01L 23/528* (2013.01); *H01L 29/0649* (2013.01); *H01L 29/0865* (2013.01); *H01L 29/0873* (2013.01); *H01L 29/0882* (2013.01); *H01L 29/4232* (2013.01); *H01L 29/7816* (2013.01)

(58) Field of Classification Search
CPC ............... H01L 27/0886; H01L 23/528; H01L 29/0649; H01L 29/0865; H01L 29/0873; H01L 29/0882; H01L 29/4232; H01L 29/7816
See application file for complete search history.

(56) References Cited

U.S. PATENT DOCUMENTS 7,838,948 B2 11/2010 Gossner
8,106,439 B2 1/2012 Nowak
(Continued)

FOREIGN PATENT DOCUMENTS

JP 5280056 B2 9/2013
KR 0560816 B1 3/2006

*Primary Examiner* — Yasser A Abdelaziez
(74) *Attorney, Agent, or Firm* — Harness, Dickey & Pierce, P.L.C.

(57) ABSTRACT

According to example embodiments, a semiconductor device includes a first fin, a second fin that is separated from the first fin, and a gate on the first fin and the second fin. The gate crosses the first fin and the second fin. The first fin includes a first doped area at both sides of the gate. The first doped area is configured to have a first voltage applied thereto. The second fin includes a second doped area at both sides of the gate. The second doped area is configured to have a second voltage applied thereto. The second voltage is different than the first voltage.

18 Claims, 18 Drawing Sheets

(51) Int. Cl.
*H01L 29/06* (2006.01)
*H01L 29/423* (2006.01)
*H01L 29/08* (2006.01)
*H01L 23/528* (2006.01)

(56) References Cited

U.S. PATENT DOCUMENTS

| | | |
|---|---|---|
| 8,134,209 B2 | 3/2012 | Yagishita et al. |
| 8,373,165 B2 | 2/2013 | Son et al. |
| 8,541,267 B2 | 9/2013 | Sonsky et al. |
| 8,629,420 B1 | 1/2014 | Shrivastava et al. |
| 2012/0292715 A1 | 11/2012 | Hong et al. |
| 2013/0011985 A1 | 1/2013 | Ratnam |
| 2013/0062692 A1 | 3/2013 | Chen et al. |
| 2013/0264630 A1 | 10/2013 | Kim et al. |
| 2014/0092506 A1 | 4/2014 | Ahsan et al. |
| 2014/0151804 A1 | 6/2014 | Meiser et al. |
| 2015/0076610 A1* | 3/2015 | Ito .................. H01L 29/785 257/365 |
| 2015/0257462 A1* | 9/2015 | Hazani ............... A41D 13/088 2/16 |
| 2016/0181358 A1* | 6/2016 | Zhang ............. H01L 29/66689 257/339 |

* cited by examiner

SEMICONDUCTOR DEVICE USING THREE DIMENSIONAL CHANNEL

CROSS-REFERENCE TO RELATED APPLICATION

This application is a continuation of U.S. application Ser. No. 14/803,265, filed on Jul. 20, 2015, which claims priority under 35 U.S.C. § 119 to Korean Patent Application No. 10-2014-0163378, filed on Nov. 21, 2014 in the Korean Intellectual Property Office, the entire contents of each of the above-referenced applications are hereby incorporated by reference.

BACKGROUND

1. Field

The present disclosure relates to a semiconductor device, and more particularly, to a semiconductor device using a three dimensional channel, and/or a method of manufacturing the same.

2. Description of Related Art

Recently, a multi-gate transistor, which forms a silicon body of a fin or nanowire shape on a substrate and forms a gate on a surface of the silicon body, has been suggested as one of scaling technologies for increasing the density of a semiconductor device.

Such a multi gate transistor uses a 3 dimensional (3D) channel. Further, the electric current control capability may be improved without increasing the gate length of the multi gate transistor. Further, the short channel effects (SCE), in which the electric potential of the channel area is influenced by the drain voltage, may be limited.

Further, a laterally diffused MOS (LDMOS) or a drain extended MOS (DEMOS) may be applied as a gate transistor (e.g., a finFET), but the width of the fin may be fixed, and affect characteristics of the LDMOS or DEMOS (e.g., a high breakdown voltage and a low on-resistance).

SUMMARY

The present disclosure relates to a semiconductor device including a 3 dimensional channel, and having a high breakdown voltage and a low on resistance.

In accordance with example embodiments of inventive concepts, a semiconductor device includes a first fin, a second fin that is separated from the first fin, and a gate on the first fin and the second fin. The gate crosses the first fin and the second fin. The first fin includes a first doped area at both sides of the gate. The first doped area is electrically configured to have a first voltage applied thereto. The second fin includes a second doped area at both sides of the gate. The second doped area is configured to have a second voltage applied thereto. The second voltage is different than the first voltage.

In example embodiments, the first fin may include a first well of a first conductive type. The first well may be formed along a first direction under a lower part of the gate. The gate may extend lengthwise in the first direction.

In example embodiments, the first fin may extend lengthwise in a second direction. The second direction may be different than the first direction. The first well may extend along the second direction in the first fin. The first doped area may be in the first well.

In example embodiments, the second fin may extend lengthwise in the second direction. A second well of a second conductive type may be formed in at least a part within the second fin. The second conductive type may be different than the first conductive type. The second doped area may be in the second well.

In example embodiments, the semiconductor device may further include a substrate. The first fin and the second fin may be one of on the substrate and defined by the substrate. A first well may be in the first fin and a portion of the substrate under a lower part of the gate. A width of the first well under the lower part of the gate may be greater than a width of the first fin.

In example embodiments, the semiconductor device may further include a first active area and a second active area. The second active area may be separated from the first active area. The first fin may be on the first active area and the second fin may be on the second active area.

In example embodiments, the semiconductor device may further include a deep trench isolation layer (DTI) separating the first active area and the second active area from each other.

In example embodiments, the first active area and the second active area may be defined by a substrate. The substrate may include a drift region between the first active area and the second active area and below a lower part of the gate. The semiconductor device may be configured to flow an on current from the first doped area to the second doped area via the drift region if a turn-on voltage is applied to the gate.

In example embodiments, the first fin may be defined by a shallow trench isolation (STI) in the first active area.

In example embodiments, the first active area may define a plurality of first fins formed therein, the second area may define a plurality of second fins formed therein, and the gate may cross the plurality of first fins and the plurality of second fins.

In example embodiments, the semiconductor device may further include a first wire connected to the first doped area and a second wire connected to the second doped area. The first wire may extend parallel to the first fin. The second wire may extend parallel to the second fin.

In example embodiments, the first wire and the second wire may be in a M1 wire level.

In example embodiments, the semiconductor device may further include a dummy gate. The first fin may include a first long side and a first short side. The second fin may include a second long side and a second short side. The first long side may face the second long side. The dummy gate may be on the first short side and the second short side.

In example embodiments, the semiconductor device may be a laterally diffused MOS (LDMOS) or a drain extended MOS (DEMOS).

In accordance with example embodiments of inventive concepts, a semiconductor device includes a first fin, a second fin separated from the first fin, an insulating layer between the first fin and the second fin, a gate on the first fin and the second fin, a first well of a first conductive type, a second well of a second conductive type that is different than the first conductive type, a drain formed in the first well and the first fin, and a source formed in the second well and the second fin. The gate crosses the first fin, the second fin, and the insulating layer. The first well is formed in the first fin and in the second fin. The first well extends below a lower part of the insulating layer that overlaps with the gate. The second well is in a part of the second fin.

In example embodiments, the semiconductor device may be configured to flow an on current from the drain to the source via the first well at a lower part of the gate if a turn-on voltage is applied to the gate.

In example embodiments, the first fin may be in a first active area, the second fin may be in a second active area, and the first active area and the second active area may be separated from each other.

In example embodiments, the insulating layer may be a deep trench isolation layer (DTI).

In example embodiments, the first active area may include a plurality of first fins, the second active area may include a plurality of second fins, and the gate may cross the plurality of first fins and the plurality of second fins.

In example embodiments, the first fin and the second fin may be formed within a same active area, and the insulating layer may be a shallow trench isolation layer (STI).

In example embodiments, the semiconductor device may further include a first wire connected to the drain and a second wire connected to the source. The first wire may extend parallel to the first fin. The second wire may extend parallel to the second fin.

In example embodiments, a width of the first well at a position below a lower part of the gate may be larger than a width of the first fin.

In accordance with example embodiments of inventive concepts, a semiconductor device includes a first fin and a second fin that are adjacent to each other and separated from each other, a long side of the first fin facing a long side of the second fin; a gate on the first fin, the gate crossing the first fin and the second fin; a first well of a first conductive type, the first well being formed in the first fin; a second well of the first conductive type, the second well being formed in at least a part of an area which overlaps with the gate; and a third well of a second conductive type that contacts the second well in the second fin. The second conductive type is different than the first conductive type.

In example embodiments, the first well and the second well may be connected to each other.

In example embodiments, the semiconductor device may further include a first doped area of the first conductive type in the first well. The semiconductor device may further include a second doped area of the first conductive type in the third well.

Example embodiments, the first fin may be in a first active area. The second fin may be in a second active area that is separated from the first active area.

In example embodiments, the insulating layer may be a deep trench isolation layer (DTI).

In accordance with example embodiments of inventive concepts, a semiconductor device includes a first fin and a second fin that separated from each other and adjacent to each other, a long side of the first fin facing a long side of the second fin; a gate on the first fin and the second fin, the gate crossing the first fin and the second fin; a first wire connected to the first fin, the first wire extending parallel to the first fin; and a second wire connected to the second fin, the second wire extending parallel to the second fin.

In example embodiments, the first wire and the second wire may be in a M1 wire level.

In example embodiments, a first power source configured to apply a first voltage may be connected to the first wire, and a second power source configured to apply a second voltage other than the first voltage may be connected to the second wire.

In example embodiments, the semiconductor device may further include a third wire parallel to the gate and a fourth wire parallel to the gate. The first wire may be connected to the third wire. The second wire may be connected to the fourth wire. The third wire and the fourth wire may be in a M2 wire level right above the M1 wire level.

In accordance with example embodiments of inventive concepts, a semiconductor device includes a substrate including a first area and a second area, a first transistor on the first area, and a second transistor on the second area. The first transistor includes a first fin where a drain region is formed, a second fin where a source region is formed, an insulating layer between the first fin and the second fin, a first gate on the first fin, and a drift region adjacent to a lower part of the insulating layer and overlapping the first gate. The first gate crosses the first fin, the second fin, and the insulating layer. The second transistor includes a third fin where a drain portion and a source portion are formed, and a second gate on the third fin between the drain and the source portions of the third fin.

In example embodiments, the first transistor may be configured to be turned on in response to a first driving voltage applied thereto. The second transistor may be configured to be turned on in response to a second driving voltage applied thereto. The first driving voltage may be greater than the second driving voltage.

In example embodiments, a length of the first gate may be larger than the length of the second gate.

In example embodiments, a width of the first fin, a width of the second fin, and a width of the third fin may be the same.

In example embodiments, the first transistor and the second transistor may be a laterally diffused MOS (LD-MOS) or a drain extended MOS (DEMOS).

According to example embodiments, a semiconductor device includes a layer that defines a first fin and a second fin, and a gate on the layer. The first and second fins are spaced apart from each other in a first direction and extend a second direction that crosses the first direction. The first fin includes first doped areas of a first conductive type that are spaced apart from each other. The second fin includes second doped areas of the second conductive type that are spaced apart from each other. The gate extends in the first direction over the first fin between the first doped areas and over the second fin between the second doped areas. The gate extends over a portion of the layer between the first fin and the second fin.

In example embodiments, the semiconductor device may further include a gate insulating layer between the gate and the layer. The layer may further include a first well of the first conductive type and a second well of the second conductive type. The second well may extend in the second fin such that the second doped areas may be formed in the second well. The first well may extend into the first fin, the portion of the layer, and into a portion of the second fin under the gate, such that the first doped areas of the first fin may be formed in the first well and the first well may be between parts of the second well in the second fin.

According to example embodiments, the semiconductor device may further include a first wire electrically connected to the first doped areas and a second wire electrically connected to the second doped areas. The first wire may be configured to apply a first voltage to the first doped areas. The second wire may be configured to apply a second voltage to the second doped areas. The first and second voltages may be different. The semiconductor device may be configured to flow an on current from one of the first doped areas to one of the second doped areas via the portion of the layer if a turn-on voltage is applied to the gate.

In example embodiments, the layer may be one of a semiconductor substrate and an epitaxial layer on a semiconductor substrate.

In example embodiments, the layer may include a first active area and a second active area defined by a deep trench formed in the layer, and the first fin and the second fin may be defined by a shallow trench formed in the first active area and the second active area.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
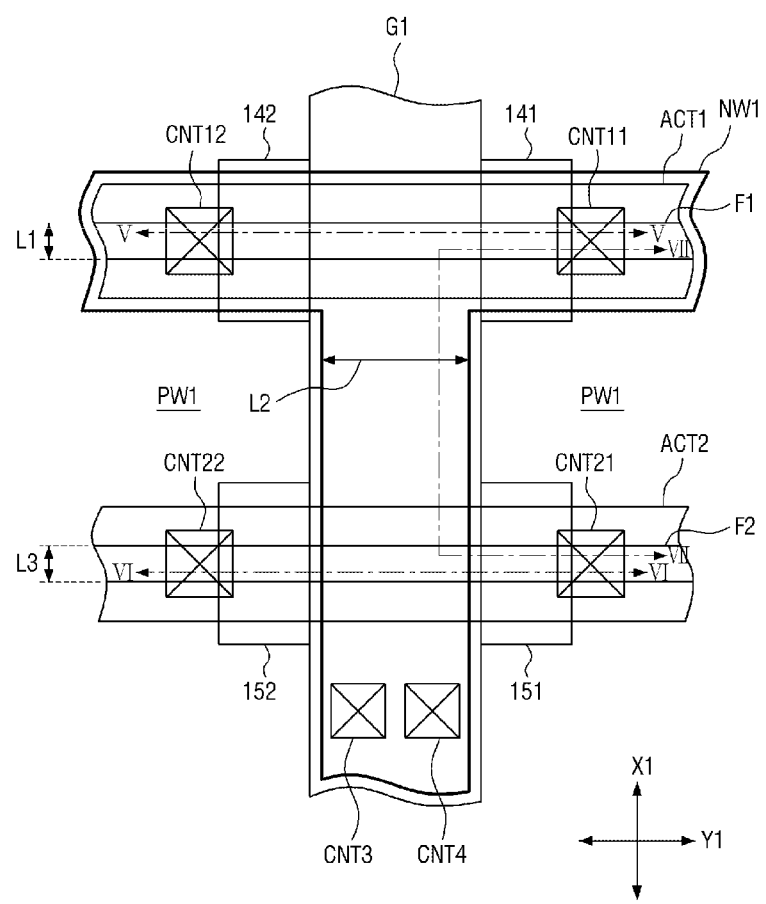
FIGS. 1 and 2 are layout diagrams illustrating a semiconductor device according to example embodiments of inventive concepts.

Example embodiments of inventive concepts will be described in detail with reference to the accompanying drawings. Inventive concepts, however, may be embodied in various different forms, and should not be construed as being limited only to the illustrated embodiments. Rather, these embodiments are provided as examples so that this disclosure will be thorough and complete, and will fully convey the scope of example embodiments of inventive concepts to those skilled in the art. Accordingly, known processes, elements, and techniques may not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other words used to describe the relationship between elements or layers should be interpreted in a like fashion (e.g., "between" versus "directly between," "adjacent" versus "directly adjacent,"

"on" versus "directly on"). As used herein the term "and/or" includes any and all combinations of one or more of the associated listed items.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
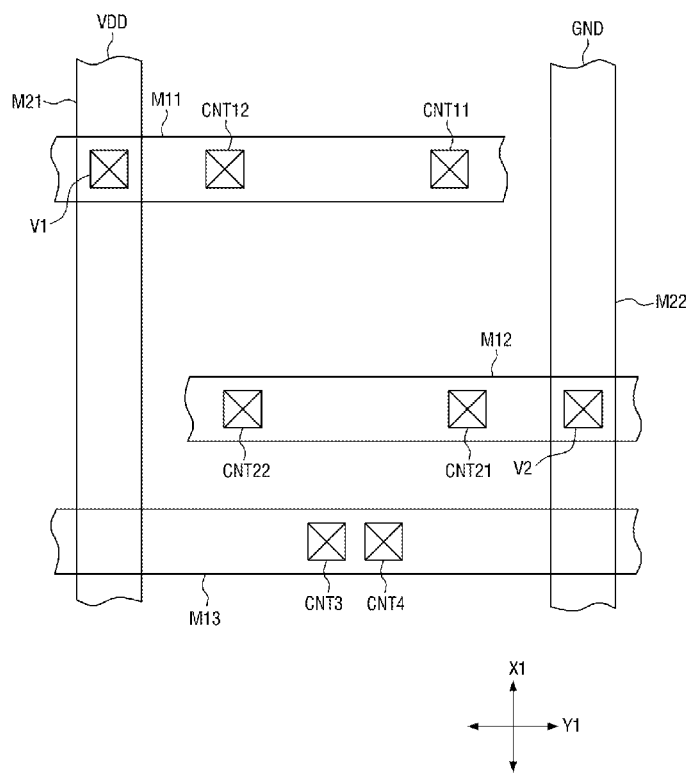
Figure 3:
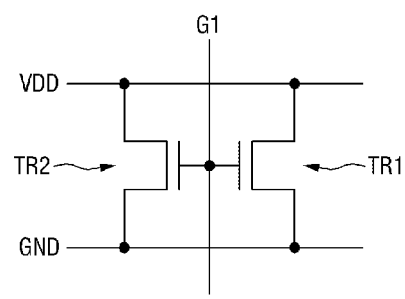
FIG. 3 is a circuit diagram of the semiconductor device of FIGS. 1 and 2.
Figure 4:
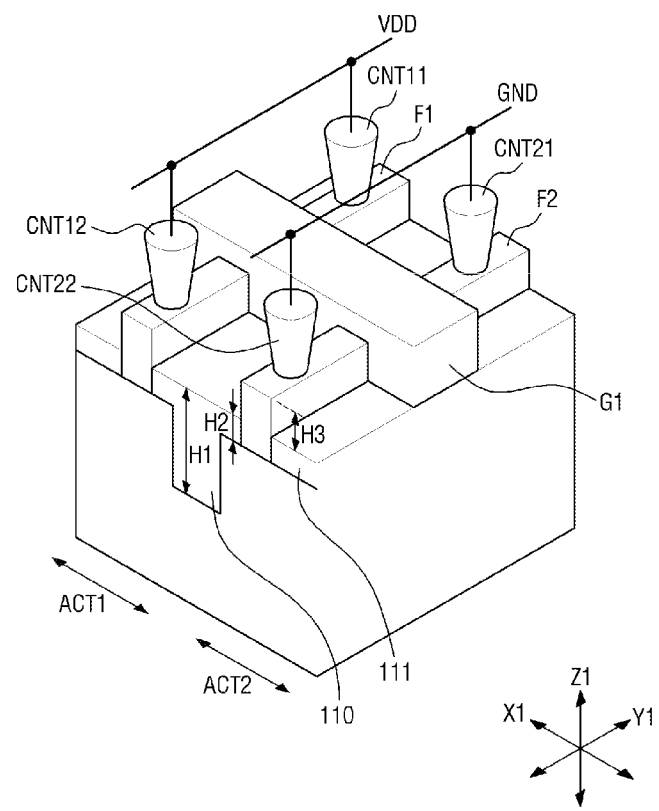
FIG. 4 is a conceptual perspective view of the semiconductor device of FIGS. 1 and 2.
Figure 5:
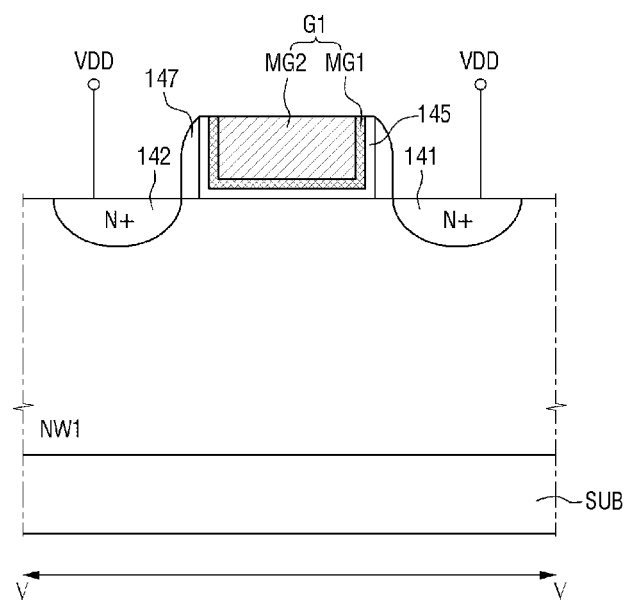
FIGS. 5 to 7 are cross-sectional views cut along V-V, VI-VI, and VII-VII lines of FIG. 1, respectively.
Figure 6:
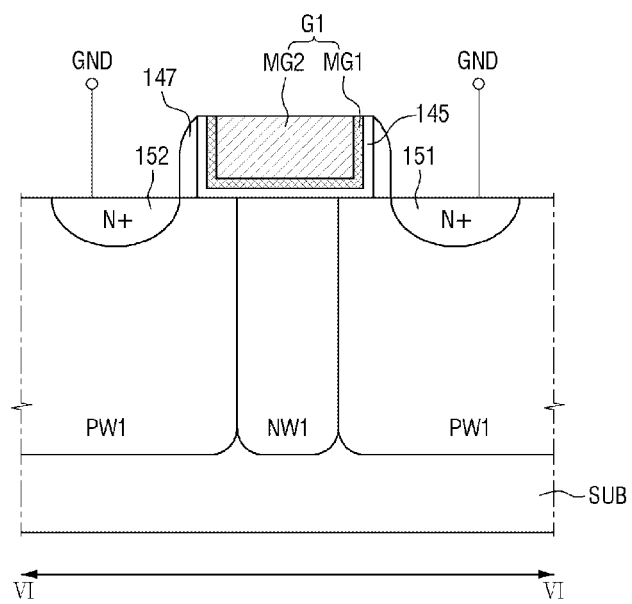
Figure 7:
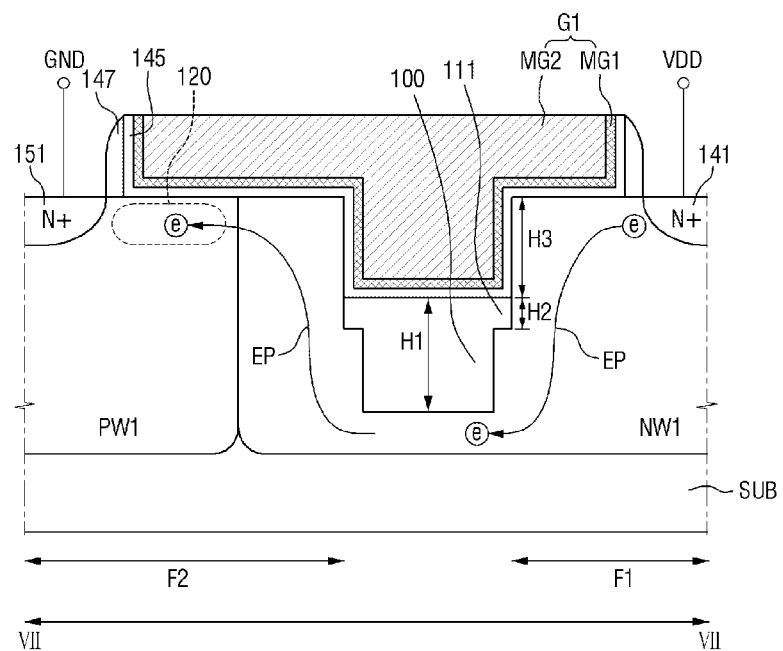

FIGS. 1 and 2 are layout diagrams illustrating a semiconductor device according to example embodiments of inventive concepts. FIG. 1 illustrates an active area, a gate, a well, and a contact, and FIG. 2 illustrates wires of M1 wire level and M2 wire level which are connected to the contacts of FIG. 1. FIG. 3 is a circuit diagram of the semiconductor device of FIGS. 1 and 2. FIG. 4 is a conceptual perspective view of the semiconductor device of FIGS. 1 and 2. FIGS. 5 to 7 are cross-sectional views cut along V-V, VI-VI, and VII-VII lines of FIG. 1, respectively.

First, referring to FIGS. 1, 2, and 4, a semiconductor device according to example embodiments of inventive concepts includes a first active area ACT1, a first fin F1, a second active area ACT2, a second fin F2, a gate G1, a first well NW1, a second well PW1, first doped areas 141 and 142, and second doped areas 151 and 152.

The fin F1 and the second fin F2 are formed on a substrate. The first fin F1 and the second fin F2 may be defined by a layer. For example, the first fin F1 and the second fin F2 may be a part of the substrate SUB and may include an epitaxial layer which has grown up from a substrate SUB. The substrate may be made of one or more semiconductor materials which are selected from a group consisting of Si, Ge, SiGe, GaP, GaAs, SiC, SiGeC, InAs, and InP. Further, a silicon on insulator (SOI) substrate may also be used.

The first fin F1 and the second fin F2 are extended long in the same direction, for example, in the second direction Y1. For example, the first fin F1 and the second fin F2 may be formed in a quadrangle form. In such a case, the long side of the first fin F1 and the long side of the second fin F2 may be arranged to be faced with each other. It was illustrated in the drawings that the shape is rectangular, but the edge part may be chamfered and a different shape is also possible.

Further, the first fin F1 and the second fin F2 may be separately disposed while being adjacent to each other. That is, another fin may not be disposed between the first fin F1 and the second fin F2.

The gate G1 may be disposed to cross the first fin F1 and the second fin F2. The gate G1 may be extended long, for example, in the first direction X1. The first direction X1 may be, for example, perpendicular to the second direction Y1. The gate G1 may be formed using crystal silicon, non-crystal silicon, metal, silicide, etc. For example, the gate G1 may be formed through a replacement process (or a gate last process). Further, the gate first process may also be used for formation.

The width L2 of the first well NW1 of the lower part of the gate G1 may be greater than the width L1 of the first fin F1 and may be greater than the width L3 of the second fin F2.

Further, the first fin F1 may be formed within the first active area ACT1, and the second fin F2 may be formed within the first active area ACT1 and the second active area ACT2. Here, the first active area ACT1 and the second active area ACT2 may be distinguished by the first insulating layer 110. For example, the first insulating layer 110 may be a deep trench isolation layer (DTI), but example embodiments are not limited thereto. For example, the first insulating layer 110 may be a shallow trench isolation (STI).

As illustrated in FIG. 4, the first insulating layer 110 (e.g., DTI) distinguishes active areas ACT1 and ACT2, and the second insulating layer 111 (e.g., STI) distinguishes the fin F1 within one active area (e.g., ACT1). The height of the first insulating layer 1110 may be H1, and the height of the second insulating layer 111 may be H2. As illustrated, H1 may be higher than H2. The first fin F1 and the second fin F2 may each have a height that is greater than the height H2 of the second insulating layer 111. H3 in FIG. 4 corresponds to a difference in height between the height of the second fin F2 and the height H2 of the second insulating layer 111. The first fin F1 may have the same height as the second fin F2.

Further, the height of the first fin F1 and the second fin F2 may be H2.

It was illustrated in FIGS. 1 and 4 that one first fin F1 is disposed within the first active area ACT1, and one second fin F2 is disposed within the second active area ACT2, but example embodiments are not limited thereto. For example, two or more first fins F1 may be disposed within the first active area ACT, and two or more first fins F1 may be disposed within the second active area ACT2. As described above, STI may be positioned between the two or more fins F1 within one active area ACT1.

The first well NW1 may be of a first conductive type (e.g., N well). As illustrated in FIG. 1, the first well NW1 may be extended long in the second direction Y1. Specifically, the first well NW1 may be formed within the first active area ACT1 (and the first fin). Further, the first well NW1 may be formed long along the first direction X1 at the lower part of the gate G1. Further, the first well NW1 may be formed within a part of the second active area ACT2 (and a part of the second fin F2). As illustrated, the first well may be formed in a T shape.

The first doped areas 141 and 142 of the first conductive type, which are disposed at both sides of the gate G1, may be formed within the first well NW1 of the first conductive type. The first doped areas 141 and 142 may be drains.

The second well PW1 may be of a second conductive type (e.g., P well). The second well PW1 may be formed within an area where the first well NW1 has not been formed. The second well PW1 may be formed to contact the first well NW1. For example, the second well PW1 may be formed within the remaining area of the second active area ACT2 (and the remaining area of the second fin F2).

The second doped areas 151 and 152 of the first conductive type, which are disposed at both sides of the gate G1, may be formed within the second well PW1 of the second conductive type. The second doped areas 151 and 152 may be the source.

Referring to FIGS. 1 and 2, the first doped areas 141 and 142 may be electrically connected to have the first voltage (e.g., VDD) applied thereto.

Here, the first wire M11 may be arranged in parallel with the extended direction (e.g., the second direction Y1) of the first fin F1 and may be connected to the first fin F1 (e.g., the first doped areas 141 and 142 or drain) through the contacts CNT11 and CNT12. Here, the first wire M11 may be disposed on the M1 wire level. The M1 wire level may be the wire level of the transistor (specifically, the lowest level which has been formed on the gate, source, and drain of the transistor). Further, the third wire M21 may be disposed in parallel with the extended direction (e.g., the first direction X1) of the gate G1, and the third wire M21 may be the M2 wire level right above the M1 wire level. A first voltage VDD may be applied to the first wire M11 and the third wire M21. The same voltage VDD may be applied to the first doped areas 141 and 142 which are disposed at both ends of the gate G1. The first wire M11 and third wire M21 may be electrically connected to each other through a first via contact V1. The second wire M12 and the fourth wire M22 may be electrically connected to each other through a second via contact V2.

Further, the second doped areas 151 and 152 may be electrically connected to the second voltage (e.g., GND).

Here, the second wire M12 may be disposed in parallel with the extended direction (e.g., the second direction Y1) of the second fin F2 and may be connected to the second fin F2 (e.g., the second doped areas 151 and 152 or the source) through the contacts CNT21 and CNT 22. Here, the second wire M12 may be disposed on the M1 wire level. Further, the fourth wire M22 may be disposed in parallel with the extended direction (e.g., the first direction X1) of the gate G1, and the fourth wire M22 may be the M2 wire level right above the M1 wire level. A second voltage GND may be applied to the second wire M12 and the fourth wire M22. Hence, the same voltage GND may be applied to the second doped areas 151 and 152 which area disposed at both sides of the gate G1.

Further, the fifth wire M13 may be connected to the gate G1 through contacts CNT3 and CNT4. The fifth wire M13 may be disposed on the M1 wire level. The fifth wire M13 may be extended long in the first direction X1 in parallel with the first wire M11 and the second wire M12.

Referring to FIG. 3, a semiconductor device according to example embodiments of inventive concepts may include two transistors TR1 and TR2. That is, the two transistors TR1 and TR2 share the gate G1, and the first voltage VDD may be applied to the drain of the transistor TR1 and the drain of the transistor TR2 through respective contacts CNT11 and CNT12. Further, the second voltage may be applied to the source of the transistor TR1 and the source of the transistor TR2 through the contacts CNT21 and CNT22, respectively.

Here, referring to FIG. 5, the first well NW1 of the first conductive type may be formed on the entire first fin F1. Further, the first doped areas 141 and 142 of the first conductive type may be formed within the first well NW1 at both sides of the gate G1. As shown in FIG. 5, the gate G1 may include a first metal gate layer MG1 and a second metal gate layer MG2 on a gate insulating layer 145. The first metal gate layer MG1 and second metal gate layer MG2 may be between a pair of spacers 147. The gate insulating layer 145 may include at least one among SiO2, SiN, SiON, SiC, SiCN, SiOCN, SiOC, SiBN, and SiBCN. Also, the gate insulating layer 145 may include a high-k dielectric material. The high-k dielectric material may include one or more among a hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the material of the gate insulating layer 145 is not limited thereto. The spacers 147 may include at least one among a silicon oxide, a silicon nitride, a silicon oxynitride, and a silicon oxycarbonitride, and combinations thereof. Also, the spacers 147 may be formed as single layers or may be formed as multiple layers. The first metal gate layer MG1 may serve as a diffusion barrier with respect to a metal forming the second metal layer MG2. The first metal gate layer MG1 may include at least one of metal nitrides such as TiN, TaN, and WN, or TiC and TaC. The second metal gate layer MG2 may be formed of at least one of aluminum (Al), tungsten (W), and molybdenum (Mo).

Referring to FIG. 6, the first well NW1 of the first conductive type may be formed in at least a part of an area which overlaps with the gate G1 within thin the second fin F2. Further, the second well PW1 of the second conductive type may be formed in contact with the second well PW1 within the second fin F2. The second doped area 151 and 152 of the first conductive type, which has been formed within the second well, may be formed at both sides of the gate G1.

As described above, the first well NW1 of the first fin F1 and the first well NW1 within the second fin F2 may have been connected to each other.

The operation of the semiconductor device according to example embodiments of inventive concepts will be described with reference to FIG. 7.

In the semiconductor device according to example embodiments of inventive concepts, the drain (e.g., first doped areas 141 and 142) and the source (e.g., second doped areas 151 and 152) are formed at different fins F1 and F2, respectively.

As described above, insulating layers 110 and 111 may be disposed between the first fin F1 and the second fin F2. The insulating layer 110 may be DTI and the insulating layer 111 may be STI, but example embodiments are not limited thereto.

The first well NW1 is formed in the first fin F1, the area under the gate G1 (e.g., the area between the first fin F1 and the second fin F2), and the second fin F2. The second well PW1 is formed within the second fin F2 while contacting the first well NW1. As illustrated, the first well has been formed deeper than the insulating layers 110 and 111.

If a turn-on voltage is applied to the gate G1, a channel 120 is formed within the second fin F2 of the lower part of the gate G1. Hence, the on current EP flows into the source within the second fin via the first well NW1 of the lower part of the gate G1 in the drain within the first fin F1. The first well NW1 area at the lower part of the gate G1 becomes a drift region.

As illustrated, the on current EP is not concentrated on the contact surface of the gate G1 and the fins F1 and F2. The on current EP flows in the downward direction (e.g., to the bottoms surface of the substrate SUB) from the drain of the first fin F1 and passes the area under the insulating layer 110. Further, after passing the insulating layer 110, the current is directed toward the source side of the second fin F2.

When a fin-shaped transistor is manufactured by forming a source and a drain within one fin, a fin, which becomes the current path, has a big resistance due to the characteristic. There are a lot of fields between the gate and the fin (or between the gate and the STI), and thus the area between the gate and the fin may become a weak area. When a CMOS device for a high voltage is made with a fin-shaped transistor, the performance may be significantly deteriorated.

However, in the case of the semiconductor device according to example embodiments of inventive concepts, the on current EP does not flow well to the contact surface between the gate G1 and fins F1 and F2. Further, as illustrated in FIG. 1, the width L2 of the first well NW1 at the lower part of the gate G1 is greater than the width L1 of the first fin F1. That is, the on current EP flows through the first well NW1 having a wide width L2. That is, the current path of the on current EP is significantly wide. Hence, a high on current EP flows compared to the fin-shaped transistor where the source and the drain have been formed within one fin. This means that a high breakdown voltage and an on resistance may be implemented.

Figure 8:
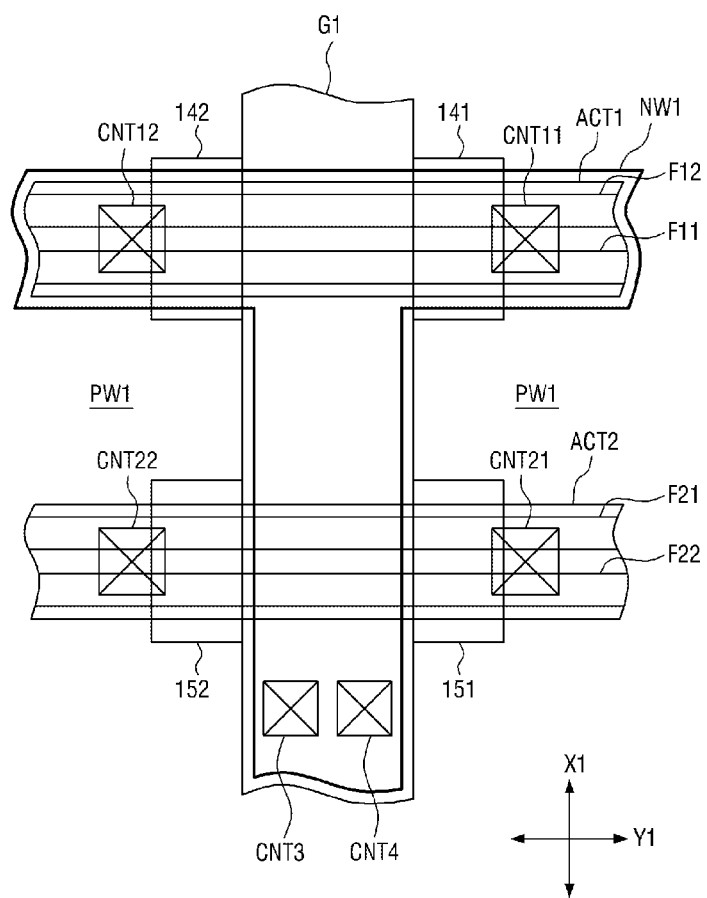
FIG. 8 is a layout diagram illustrating a semiconductor device according to example embodiments of inventive concepts.

FIG. 8 is a layout diagram illustrating a semiconductor device according to example embodiments of inventive concepts. The description will focus on the differences with what has been described with reference to FIGS. 1 to 7 for the convenience of explanation.

Referring to FIG. 8, a plurality of first fins F11 and F12 may be formed within the first active area ACT1. A plurality of second fins F21 and F22 may be formed within the second active area ACT2. Two first fins F11 and F12 and two second fins F21 and F22 are illustrated in the drawings, but example embodiments are not limited thereto. That is, three or more first fins F11 and F12 and three or more second fins F21 and F22 may be formed. Further, although FIG. 8 illustrates the number of the first fins F1 formed within the first active area ACT1 may be the same as the number of the second fins F2 formed within the second active area ACT2, example embodiments are not limited thereto. For example, the number of the first fins F1 formed within the first active area ACT1 may be different than (e.g., greater than or less than) than the number of the second fins F2 formed within the second active area ACT2.

Further, the contacts may be formed to simultaneously contact the two first fins F11 and F12. The contacts CNT21 and CNT22 may be formed to simultaneously contact the two second fins F21 and F22.

Figure 9:
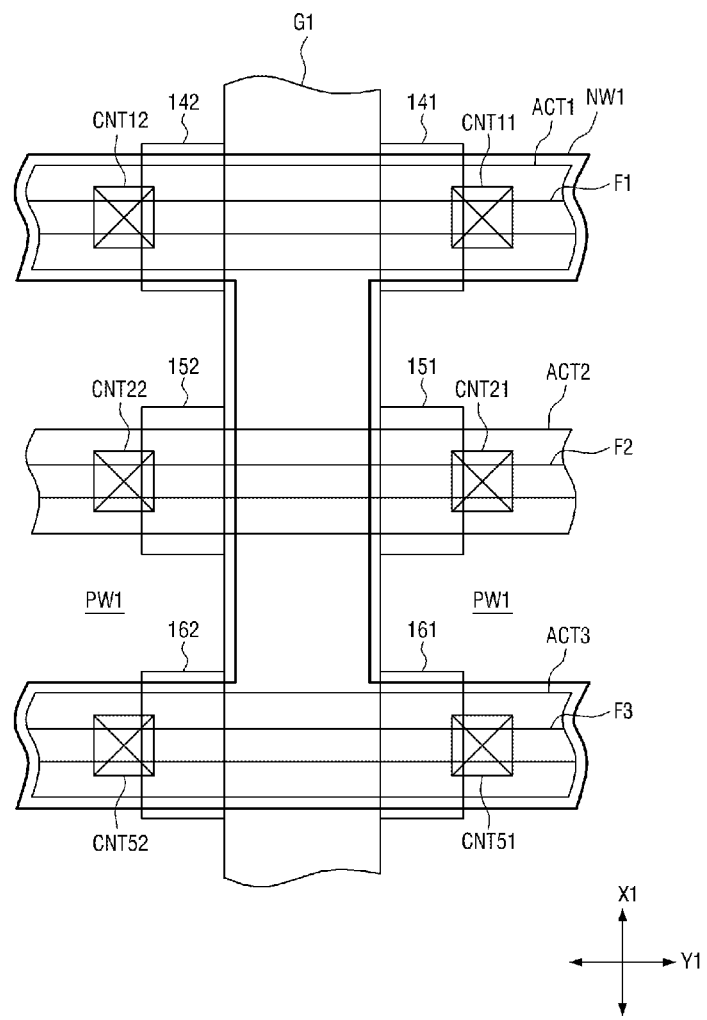
FIG. 9 is a layout diagram illustrating a semiconductor device according to example embodiments of inventive concepts.

FIG. 9 is a layout diagram illustrating a semiconductor device according to example embodiments of inventive concepts. The description will focus on the differences with what has been described with reference to FIGS. 1 to 7 for the convenience of explanation.

Referring to FIG. 9, the first fin F1, the second fin F2, and the third fin F3 are formed to be extended long in the second direction Y1. The first fin F1, the second fin F2, and the third fin F3 may be disposed to be directly adjacent to each other.

The gate G1 may be disposed to cross the first fin F1 to the third fin F3.

The first fin F1 may be formed within the first active area ACT1, the second fin F2 may be formed within a second active area ACT2 which is separated from the first active area ACT1, and the third fin F3 may be formed within the third active area ACT3 which are separated from the first active area ACT1 and the second active area ACT2. The deep trench isolation layer (DTI) may distinguish the active areas ACT1, ACT2, and ACT3, but example embodiments are not limited thereto.

The first well NW1 may be formed within the first active area ACT1 (and first fin F1) and the third active area ACT3 (and third fin F3). Further, the first well NW1 may be formed long along the first direction X1 at the lower part of the gate G1. The first well NW1 may be formed within a part of the second active area ACT2 (and a part of the second fin F2). As illustrated, the first well NW1 may be formed in an I shape. The second well PW1 may be formed in another area which the first well NW1 is not formed while contacting the first well NW1.

The first doped areas 141 and 142 of the first conductive type, which are disposed at both sides of the gate G1, may be formed within the first well NW1 of the first conductive type, and the first doped areas 161 and 162 of the first conductive type, which are disposed at both sides of the gate G1, may be formed within the first well NW1 of the first conductive type. The first doped areas 141, 142, 161, and 162 may be the drain. The doped areas 141, 142, 161, and 162 may be connected to the contacts CNT11, CNT12, CNT51, and CNT52, respectively.

The second doped areas 151 and 152 of the first conductive type, which are disposed at both sides of the gate G1, may be formed within the second well PW1 of the second conductive type. The second doped areas 151 and 152 may be the source. The second doped areas 151 and 152 may be connected to the contacts CNT21 and CNT22, respectively.

That is, the doped areas 141, 142, 161, and 162 (e.g., the drain) may be positioned above and below the second doped areas 151 and 152 (e.g., the source).

Figure 10:
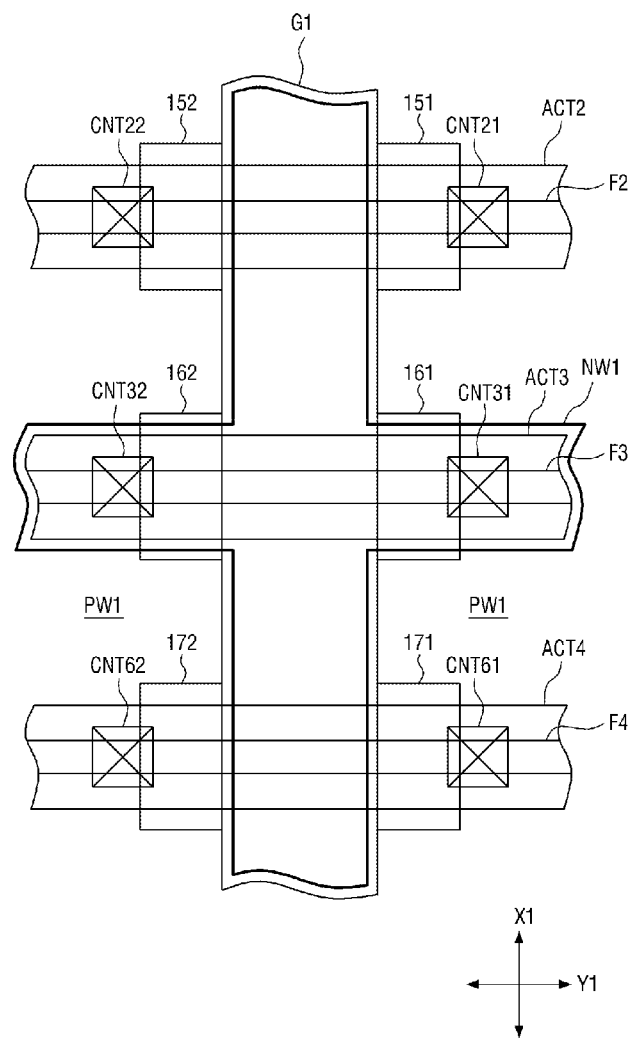
FIG. 10 is a layout diagram illustrating a semiconductor device according to example embodiments of inventive concepts.

FIG. 10 is a layout diagram illustrating a semiconductor device according to example embodiments of inventive concepts. The description will focus on the differences with what has been described with reference to FIGS. 1 to 7 for the convenience of explanation.

Referring to FIG. 10, the second fin F2, the third fin F3, and the fourth fin F3 are formed to be extended long in the same direction, for example, in the second direction Y1. The second fin F2, the third fin F3, and the fourth fin F3 may be disposed directly adjacent to each other.

The gate G1 may be disposed to cross the second fin F2 to the fourth fin F4.

The second fin F2 may be formed within the second active area ACT2, the third fin F3 may be formed within the third active area ACT3 which is separated from the second active area ACT2, and the fourth fin F4 may be formed within the fourth active area ACT4 which is separated from the second active area ACT2 and the third active area ACT3. The deep trench isolation layer (DTI) may distinguish the active areas ACT2, ACT3, and ACT4, but example embodiments are not limited thereto.

The first well NW1 may be formed within the third active area ACT3 (and third fin F3). Further, the first well NW1 may be formed long along the first direction X1 at the lower part of the gate G1. The first well NW1 may be formed within a part of the second active area ACT2 (and a part of the second fin F2) and a part of the fourth active area ACT4 (and a part of the fourth fin F4). As illustrated, the first well NW1 may be formed in a "+" shape. The second well PW1 may be formed in another area which the first well NW1 is not formed while contacting the first well NW1.

The second doped areas 151 and 152 of the first conductive type, which are disposed at both sides of the gate G1, may be formed within the second well PW1 of the second conductive type, and the second doped areas 171 and 172 of the first conductive type, which are disposed at both sides of the gate G1, may be formed within the second well PW1 of the second conductive type. The second doped areas 151, 152, 171, and 172 may be the source. The second doped areas 151, 152, 171, and 172 may be connected to the contacts CNT21, CNT22, CNT61, and CNT62, respectively.

The first doped areas 161 and 162 of the first conductive type, which have been disposed at both sides of the gate G1, may be formed within the first well NW1 of the first conductive type. The first doped areas 161 and 162 may be a drain. The first doped areas 161 and 162 may be connected to the contacts CNT31 and CNT32, respectively.

That is, the second doped areas 151, 152, 171, and 172 (e.g., the source) may be positioned above or under the first doped areas 161 and 162.

Figure 11:
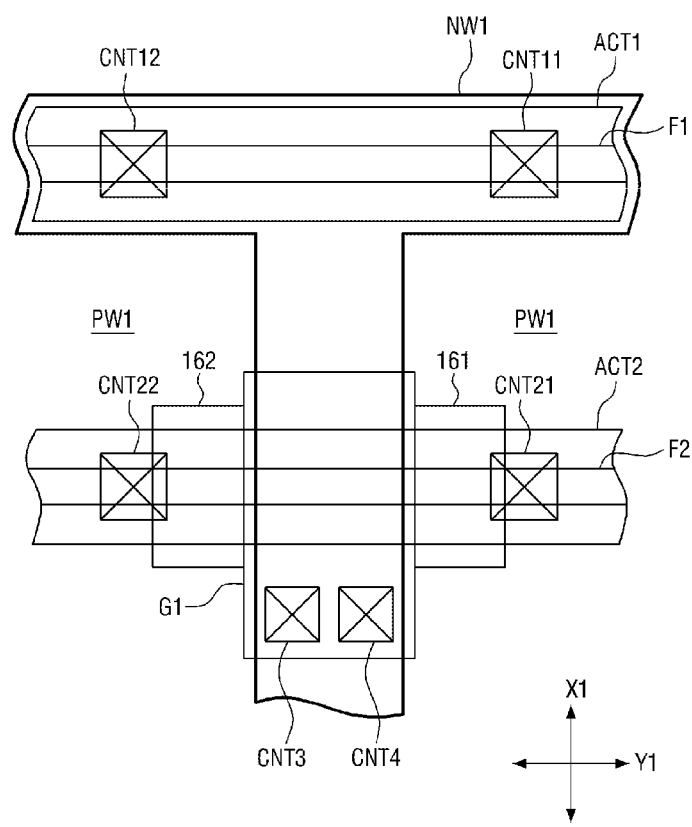
FIG. 11 is a layout diagram illustrating a semiconductor device according to example embodiments of inventive concepts.

FIG. 11 is a layout diagram illustrating a semiconductor device according to example embodiments of inventive concepts. The description will focus on the differences with what has been described with reference to FIGS. 1 to 7 for the convenience of explanation. Referring to FIG. 11, the gate G1 may be disposed not to cross the first fin F1, but to cross the second fin F2. A channel is formed in an area where the gate G1 overlaps with the second fin F2.

Figure 12:
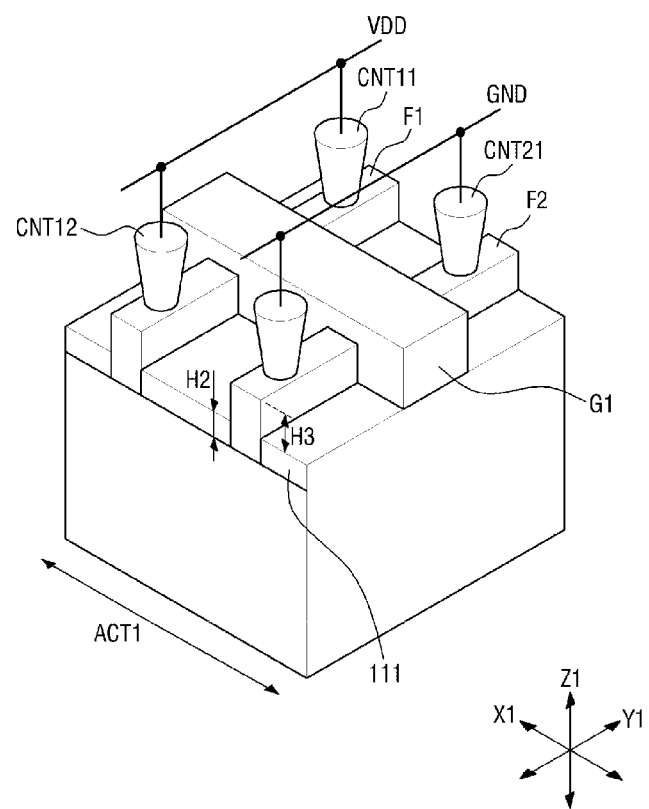
FIG. 12 is a layout diagram illustrating a semiconductor device according to example embodiments of inventive concepts.

FIG. 12 is a layout diagram illustrating a semiconductor device according to example embodiments of inventive concepts.

Referring to FIG. 12, the first fin F1 and the second fin F2 may be formed within one active area ACT1 without being formed in different active areas. Hence, a shallow trench isolation (STI) may be formed between the first fin F1 and the second fin F2. Hence, a first well NW1 may be formed under the STI under the gate G1. When compared with the case where the DTI has been formed between the first fin F1 and the second fin F2 (see FIG. 7), the length of the drift region may become shorter. However, the implementation is sufficiently possible to the products according to the design of products (e.g., according to the necessary breakdown voltage and on-resistance).

Figure 13:
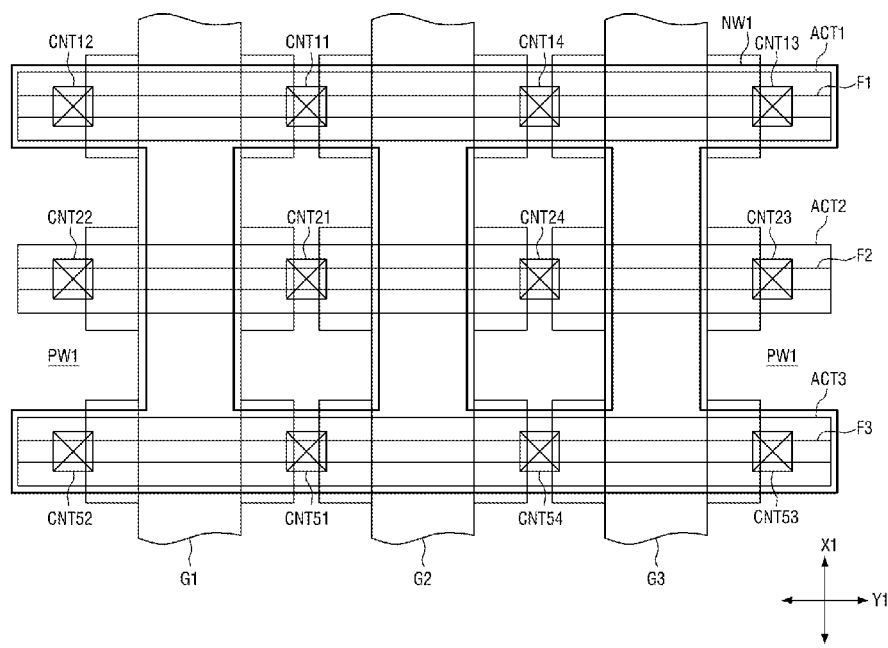
FIGS. 13 and 14 are a layout diagram and a circuit diagram illustrating a semiconductor device according to example embodiments of inventive concepts.
Figure 14:
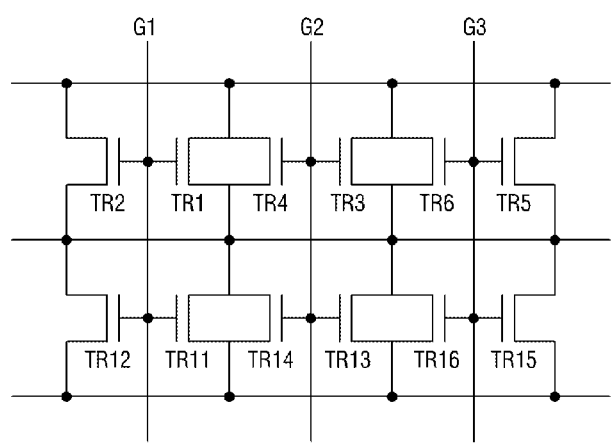

FIGS. 13 and 14 are a layout diagram and a circuit diagram illustrating a semiconductor device according to example embodiments of inventive concepts. The description will focus on the differences with what has been described with reference to FIG. 9 for the convenience of explanation.

Referring to FIG. 13, the first fin F1, the second fin F2, and the third fin F3 may be formed to extend long in the same direction, e.g., the second direction. The first fin F1, the second fin F2, and the third fin F3 may be disposed directly adjacent to each other.

The gates G1, G2, and G3 may be disposed to cross the first fin F1 to the third fin F3.

The first fin F1 may be formed within the first active area ACT1, the second fin F2 may be formed within the second active area ACT2 which is separated from the first active area ACT1, and the third fin F3 may be formed within the third active area ACT1 which is separated from the first active area ACT1 and the second active area ACT2. The deep trench isolation layer (DTI) may distinguish the active areas ACT1, ACT2, and ACT3, but example embodiments are not limited thereto.

The first well NW1 may be formed within the first active area ACT 1 (and the first fin F1) and the third active area (ACT3) (And the third fin F3). Further, the first well NW1 may be formed long along the first direction X1 under the gates G1, G2, and G3. The first well NW1 may be formed within the part of the second active area ACT2 (and part of the second fin F2). As illustrated, the first well NW1 may be formed in the III form. As shown in FIG. 13, contacts CNT13 and CNT14 may be on the first fin F1, contacts CNT23 and CNT24 may be on the second fin F2, and contacts CNT53 and CNT54 may be on the third fin F3. Although not shown, the contacts CNT11, CNT12, CNT13, and CNT14 may connect the first fin F1 to a line for applying the first voltage VDD thereto and the contacts CNT51, CNT52, CNT53 and CNT54 may connect the first fin F3 to a line for applying the first voltage VDD thereto. Also, the contacts CNT21, CNT22, CNT 23, and CNT24 may connect second fin F2 to a line for applying the second voltage GND thereto.

Referring to FIG. 14, the semiconductor device according to example embodiments of inventive concepts may include 12 transistors TR1 to TR6 and TR11 to TR16. For example, four transistors TR1, TR2, TR11, and TR12 share the gate G1. Four transistors TR3, TR4, TR13, and TR14 share the gate G2. Four transistors TR5, TR6, TR15, and TR16 share the gate G3.

Figure 15:
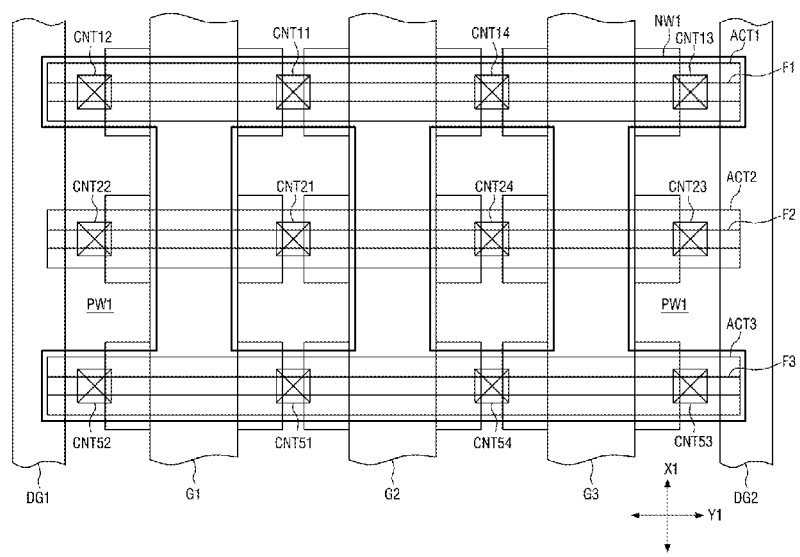
FIG. 15 is a layout diagram illustrating a semiconductor device according to example embodiments of inventive concepts.

FIG. 15 is a layout diagram illustrating a semiconductor device according to example embodiments of inventive concepts.

Referring to FIG. 15, as illustrated, the first fin F1 to the third fin F3 may be of a rectangular shape. The first active area ACT1 to the third active area ACT3 may be of a rectangular shape.

For example, the dummy gate DG1 may be formed to overlap with one side cross-section of the first fin F1, one side cross-section of the second fin F2, and one side cross-section of the third fin F3. The dummy gate DG2 may be formed to overlap with the other side cross-section of the first fin F1, the other side cross-section of the second fin F2, and other side cross-section of the third fin F3.

Further, the dummy gate DG1 may be formed to overlap with the one side cross-section of the first active area ACT1, the one side cross-section of the second active area ACT2, and the one side cross-section of the third active area ACT3. The dummy gate DG2 may be formed to overlap with the other side cross-section of the first active area ACT1, the other side cross-section of the second active area ACT2, and the other side cross-section of the third active area ACT3.

The dummy gates DG1 and DG2 may limit and/or prevent generation of a leakage source at one side/the other side of the first fin F1 and the second fin F2 when performing ion-implanting to the first fin F1 and the second fin F2.

Further, when the source/drain area includes an epi-layer, the dummy gates DG1 and DG2 may be used to remove the facet.

Figure 16:
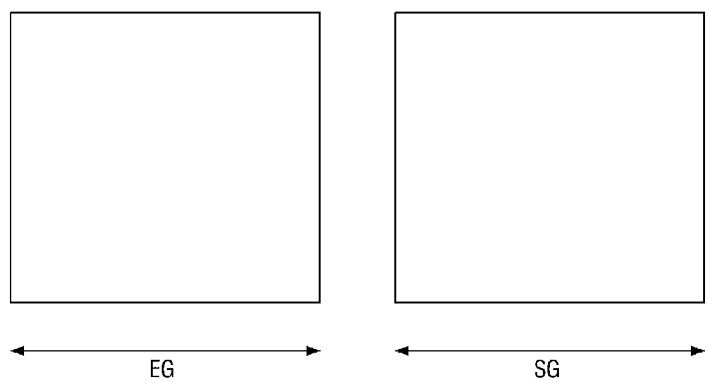
FIG. 16 is a conceptual diagram illustrating a semiconductor device according to example embodiments of inventive concepts.
Figure 17:
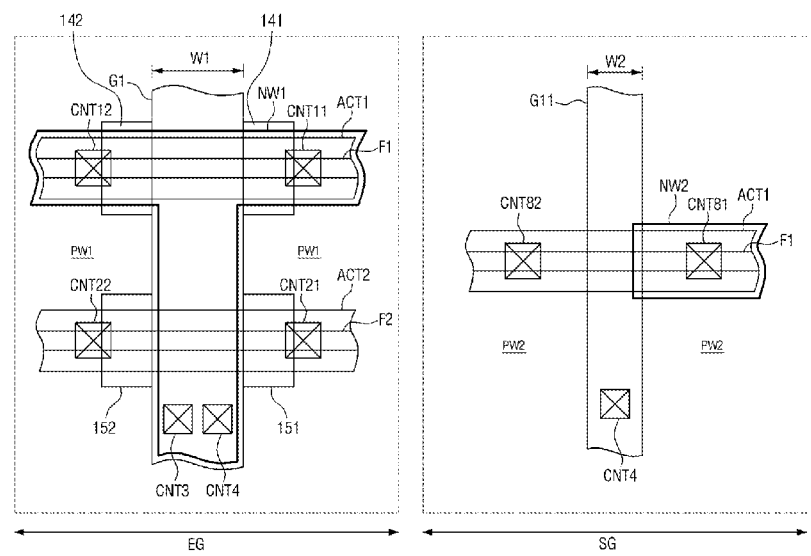
FIG. 17 is a layout diagram example of a first area and a second area of FIG. 16.

FIG. 16 is a conceptual diagram illustrating a semiconductor device according to example embodiments of inventive concepts. FIG. 17 is a layout diagram example of a first area and a second area of FIG. 16.

Referring to FIGS. 16 and 17, the first area EG and the second area SG may be defined within the substrate. A transistor for a first driving voltage may be formed within the first area EG, and a transistor for a second driving voltage may be formed within the second area SG. Here, the first driving voltage may be higher than the second driving voltage. For example, the first transistor may be used for a high voltage, and the second transistor may be used for a normal voltage. The first driving voltage may be a turn-on voltage for the transistor for the first driving voltage. The second driving voltage may be a turn-on voltage for the transistor for the second driving voltage.

At least one of the semiconductor devices according to example embodiments of inventive concepts may be used as the transistor which is formed in the first area EG. FIG. 17 illustrates a semiconductor device illustrated in FIG. 1 for the convenience of explanation. That is, such a transistor may include a first fin F1, a second fin F2, an insulating layer formed between the first fin and the second fin, a gate G1 which is formed to cross the first fin F1, the second fin F2, and the insulating layer, a first well NW1 of a first conductive type, which is formed within the first fin F1, is formed under the insulating layer overlapping with the gate G1, and is formed within a part of the second fin F2, a second well PW1 of a second conductive type other than the first conductive type, which is formed within a part of the second fin F2, a drain formed within the first well NW1 within the first fin F1, and a source which has been formed within the second well PW1 within the second fin F2. The on-current may flow from the drain to the source via the first well NW1 under the gate G1.

In the transistor formed in the second area SG, the gate G11 is formed to cross the fin F11. The source and the drain are formed at both sides of the gate G11 within one fin F11. The well NW2 of the first conductive type may be formed in the direction in which the fin F11 is extended and may be formed only in a part of the gate G1 and the drain. The well NW2 of the first conductive type may not be formed at the source side. The second well PW2 of the second conductive type may be next to the well NW2 of the first conductive type.

The width of the first fin F1, which is formed in the first area EG, may be the same as the width of the fin F11 which has been formed in the second area SG.

In order to enhance the electric current driving capability, the width W1 of the gate G1, which is formed in the first area EG, may be larger than the width W2 of the gate G1 which is formed in the second area SG.

Figure 18:
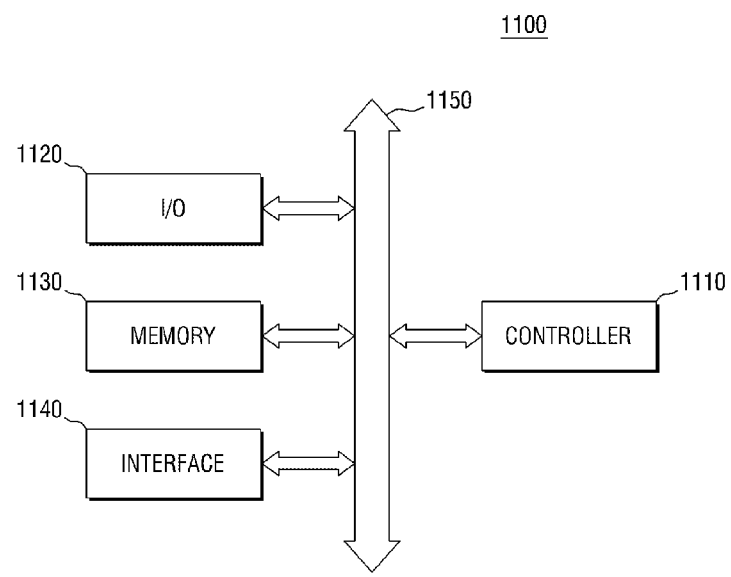
FIG. 18 is a block diagram of an electronic system including a semiconductor device according to example embodiments of inventive concepts.

FIG. 18 is a block diagram of an electronic system including a semiconductor device according to example embodiments of inventive concepts. The electronic system of FIG. 18 is an illustrative system to which the semiconductor device, which has been described using FIGS. 1 to 17, may be applied.

Referring to FIG. 18, an electronic system 1100 according to example embodiments of inventive concepts includes a controller 1110, an input/output device 1120 (I/O), a memory device 1130, an interface 1140, and a bus 1150. The controller 1110, the input/output device 1120, the memory 1130, and/or the interface 1140 may be coupled through the bus 1150. The bus 1150 corresponds to a path through which data moves.

The controller 1110 may include at least of logic devices capable of performing functions of a microprocessor, a digital signal processor, and a microcontroller, and other similar functions. The input/output device 1120 may include a keypad, a keyboard, and a display device. The memory 1130 may store data and/or commands. The interface 1140 may perform a function of transmitting data to a communication network or receiving data from a communication network. The interface 1140 may be wireless or wired. For example, the interface 1140 may include an antenna or a wired or wireless transceiver. Though not illustrated, the electronic system 1100 may include a high speed DRAM and/or SRAM as an operation memory for improving operation of the controller 1110. The semiconductor device according to example embodiments of inventive concepts may be provided within the memory device 1130 or may be provided as a part of the controller 1110, the input/output device 1120 (I/O), etc.

The electronic system 1100 may be applied to all electronic products which may transmit and/or receive a personal digital assistant (PDA), a portable computer, a web tablet, a wireless phone, a mobile phone, a digital music player, a memory card, or information in a wireless environment.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
   a first fin;
   a second fin separated from the first fin;
   an insulating layer between the first fin and the second fin;
   a gate on the first fin and the second fin, the gate crossing the first fin, the second fin, and the insulating layer;
   a first well of a first conductive type, the first well being formed in the first fin and in the second fin, the first well extending below a lower part of the insulating layer that overlaps with the gate;
   a second well of a second conductive type that is different than the first conductive type, the second well in a part of the second fin;
   a drain formed in the first well and the first fin; and
   a source formed in the second well and the second fin.

2. The semiconductor device of claim 1, wherein the semiconductor device is configured to flow an on current from the drain to the source via the first well at a lower part of the gate if a turn-on voltage is applied to the gate.

3. The semiconductor device of claim 1, wherein
   the first fin is in a first active area,
   the second fin is in a second active area, and
   the first active area and the second active area are separated from each other.

4. The semiconductor device of claim 3, wherein
the first active area includes a plurality of first fins,
the second active area includes a plurality of second fins, and
the gate crosses the plurality of first fins and the plurality of second fins.

5. The semiconductor device of claim 1, further comprising:
a first wire connected to the drain, the first wire extending parallel to the first fin; and
a second wire connected to the source, the second wire extending parallel to the second fin.

6. The semiconductor device of claim 1, wherein a width of the first well at a position below a lower part of the gate is larger than a width of the first fin.

7. The semiconductor device of claim 1, further comprising:
a third well of the first conductive type, the third well being formed in at least a part of an area of the second fin that overlaps with the gate.

8. The semiconductor device of claim 7, wherein the first well and the second well are connected to each other.

9. The semiconductor device of claim 7, further comprising:
a first doped area of the first conductive type in the first well; and
a second doped area of the first conductive type in the second well.

10. The semiconductor device of claim 7, wherein
the first fin is in a first active area, and
the second fin is in a second active area that is separated from the first active area.

11. The semiconductor device of claim 10, wherein the insulating layer is a deep trench isolation layer (DTI).

12. The semiconductor device of claim 1, comprising:
a first wire connected to the first fin, the first wire extending parallel to the first fin; and
a second wire connected to the second fin, the second wire extending parallel to the second fin, wherein
the first fin and the second fin are adjacent to each other, and
a long side of the first fin faces a long side of the second fin.

13. The semiconductor device of claim 12, wherein the first wire and the second wire are in an M1 wire level.

14. The semiconductor device of claim 12, wherein
a first power source configured to apply a first voltage is connected to the first wire, and
a second power source configured to apply a second voltage other than the first voltage is connected to the second wire.

15. The semiconductor device of claim 14, further comprising:
a third wire parallel to the gate; and
a fourth wire parallel to the gate, wherein
the first wire is connected to the third wire,
the second wire is connected to the fourth wire, and
the third wire and the fourth wire are in an M2 wire level right above the M1 wire level.

16. The semiconductor device of claim 1, wherein the second well contacts the first well in the second fin.

17. The semiconductor device of claim 1, further comprising:
a first doped area of the first conductive type in the first well; and
a second doped area of the first conductive type in the second well.

18. The semiconductor device of claim 1, wherein the insulating layer is a deep trench isolation layer (DTI).

* * * * *